US009466592B2

(12) United States Patent
Chen et al.

(10) Patent No.: US 9,466,592 B2
(45) Date of Patent: Oct. 11, 2016

(54) MULTI-CHIPS IN SYSTEM LEVEL AND WAFER LEVEL PACKAGE STRUCTURE

(71) Applicant: Gainia Intellectual Asset Services, Inc., Zhudong Township, Hsinchu County (TW)

(72) Inventors: Shih-Chi Chen, Zhubei (TW); Hao-Pai Lee, Zhudong Township, Hsinchu County (TW)

(73) Assignee: GAINIA INTELLECTUAL ASSET SERVICES, INC., Hsinchu County (TW)

( * ) Notice: Subject to any disclaimer, the term of this patent is extended or adjusted under 35 U.S.C. 154(b) by 0 days.

(21) Appl. No.: 15/049,587

(22) Filed: Feb. 22, 2016

(65) Prior Publication Data

US 2016/0172345 A1    Jun. 16, 2016

Related U.S. Application Data

(63) Continuation-in-part of application No. 13/920,468, filed on Jun. 18, 2013, now Pat. No. 9,299,626.

(30) Foreign Application Priority Data

Jan. 16, 2013   (TW) .............................. 102200928 U

(51) Int. Cl.

| H01L 23/48 | (2006.01) |
|---|---|
| H01L 23/52 | (2006.01) |
| H01L 29/40 | (2006.01) |
| H01L 25/16 | (2006.01) |
| H01L 23/13 | (2006.01) |
| H01L 23/31 | (2006.01) |
| H01L 23/495 | (2006.01) |
| H01L 23/498 | (2006.01) |
| H01L 23/00 | (2006.01) |

(52) U.S. Cl.
CPC .............. *H01L 25/16* (2013.01); *H01L 23/13* (2013.01); *H01L 23/3114* (2013.01); *H01L 23/3121* (2013.01); *H01L 23/4951* (2013.01); *H01L 23/4985* (2013.01); *H01L 24/16* (2013.01); *H01L 24/48* (2013.01); *H01L 24/49* (2013.01); *H01L 24/73* (2013.01); *H01L 2224/04042* (2013.01); *H01L 2224/05554* (2013.01); *H01L2224/06136* (2013.01); *H01L 2224/48091* (2013.01); *H01L 2924/14* (2013.01); *H01L 2924/1436* (2013.01); *H01L 2924/1438* (2013.01); *H01L 2924/18165* (2013.01)

(58) Field of Classification Search
CPC ................ H01L 2224/48091; H01L 2924/14; H01L 24/48; H01L 24/73; H01L 24/49; H01L 23/13; H01L 23/3121; H01L 24/06; H01L 23/3114; H01L 2224/04042; H01L 25/16; H01L 23/4985; H01L 2924/18165; H01L 23/4951
USPC ........ 257/777, 698, 784, 723, 678, E25.012, 257/E23.02
See application file for complete search history.

(56) References Cited

U.S. PATENT DOCUMENTS

| 2009/0166847 | A1* | 7/2009 | Nin ......................... H01L 23/13 257/698 |
| 2009/0243099 | A1* | 10/2009 | Fan ......................... H01L 23/13 257/738 |

*Primary Examiner* — Thien F Tran
(74) *Attorney, Agent, or Firm* — Muncy, Geissler, Olds & Lowe, P.C.

(57) ABSTRACT

A multi-chips in system level and wafer level package structure includes a package substrate having a plurality of through holes a multi-chips with different functions and sizes, the metal wires, a package body, and the conductive components. The multi-chips are used to combine with the package substrate so as to the pads of the multi-chips are exposed out of the through holes. The pads of the multi-chips are electrically connected to the connecting terminal adjacent to the through holes by the plurality of conductive wires. The package material is filled into the through holes to form the package body to encapsulate the conductive wire, each active surface and the pads of the multi-chips with the different functions and the sizes by dispensing method so as to the multiple chip system level and wafer level package structure is accomplished by partially packaging method.

20 Claims, 17 Drawing Sheets

MULTI-CHIPS IN SYSTEM LEVEL AND WAFER LEVEL PACKAGE STRUCTURE

The present invention is a continuation-in-application of U.S. patent application Ser. No. 13/920,468, filed Jun. 18, 2013. All of the reference-application are hereby incorporated herein. by reference in their entirety.

FIELD OF THE INVENTION

The present invention relates to a multi-chips in system level and wafer level package structure, and in particular to a multi-chips with different functions and different sizes combined with the packaged substrate by using the wafer level package manufacturing process and wire bonding process to accomplish the multi-chips in wafer-level package structure chip.

BACKGROUND OF THE INVENTION

The development of semiconductor technology is very fast, in particular, a semiconductor chip tends to miniaturization of the tendency. However, the function requirement of semiconductor dice also tends to the diversification. In other words, a smaller region of the semiconductor chip requires more input/out pads so as to the density of the pins is increased quickly. Thus, the semiconductor chip is difficult to package and the yield is to be decreased.

The mainly purpose of the packaged structure is for preventing the chip from the damage. However, each the plurality of chips is formed by cutting the wafer, and packaging and testing each the plurality of chips. In addition, another package technology, which is called "Wafer Level Package, WLP", is used to package before the wafer is cut into a plurality of chips. The wafer level package technology has several advantages such as short production cycle, lower cost, and no under-filler.

Furthermore, based on the requirement of 3C consumer products is increased every year, and the requirement for the space and the size of the functional chip and the memory chip became more and more miniaturization. Accordingly the requirement of the multi-chips system in package (SiP) is also increased. However, during the wafer-level system-level packaging process, in addition to the use of sophisticated and expensive wafer bonding machine (chip bonder), such that each pads on the active surface of the chip is electrically connected accurately to the connecting terminal of the substrate, but also the chip is grounded to have the thickness is in range from 2 mil~4 mil (about 50 to 100 microns) such that the chip would be damaged due to the wafer is bonded and electrically connected to the substrate. In addition to investment in expensive equipment and the manufacturing process yields also need to improve for system in package process of wafer level system-level,

SUMMARY OF THE INVENTION

The mainly objective of the present invention is to provide a chip packaged structure. A packaged substrate is fixed on the chip after alignment process, such that the plurality of pads on the central region of the chip is exposed out of the through hole within the central region of the packaged substrate. Then, the plurality of external connecting terminals on the four sides of the packaged substrate is to be exposed after packaging process by a package body, such that the chip packaged structure with a packaged substrate can be obtained.

An objective of the present invention is to provide a chip packaged structure, particularly to suitable for large scale chip packaged process, such as a memory chip, in particular to a DRAM (dynamic random access memory), an NAND flash memory chip, NOR flash memory chip, communication IC chip, and a chip with logic I/O.

An objective of the present invention is to provide a chip packaged structure, which having a plurality of external connecting terminals that is exposed out of one surface of the chip packaged structure, and the plurality of external connecting terminals is used as the external connecting endpoint for electrically connecting with other electronic components. With respect to another surface of the plurality of external connecting terminals is the back surface of the chip, such that the chip packaged structure can achieve good heat dissipation efficiency, and good heat dissipation is very important issue for large scale IC chip.

An objective of the present invention is to provide a multi-chips in system level and wafer level package structure having a plurality of external connecting terminals that is exposed out of the package structure and the plurality of external connecting terminals is used as the connecting terminal to electrically connect with other electronic component.

An objective of the present invention is to provide a multi-chips in system level and wafer level package structure, a multi-chips of the package structure with different functions and different sizes or the plurality of chips with same functions are stacked each other and is adhered on the back surface of the packaged surface so as to the chip is to be polished to a predetermined thickness or the thickness of the back surface of the chip is not to be polished.

Another objective of the present invention is to provide a multi-chips in system level and wafer level package structure, the molding process for the multi-chips in system level and wafer level package structure only needs to fill the packaging material locally. That is, the package material is filled into the through hole and locally covered the front surface of the packaged substrate adjacent the through hole such that the package material is not to encapsulate the whole package structure by molding process. Accordingly, the pollution can be reduced that cased by the package material during the molding process.

According to above objectives, the present invention provides a chip packaged structure, which includes a chip having an active surface and a back surface, and a plurality of pads in a central region of the active surface of the chip. A packaged substrate having a through hole within a central region therein, a plurality of connecting terminals is disposed around the through hole, and a plurality of external connecting terminals is disposed on a four sides of the packaged substrate, in which the plurality of connecting terminals is electrically connected with the plurality of external connecting terminals by a plurality of metal traces. The back surface of the packaged substrate is adhered to the active surface of the chip by an adhesive layer, such that the plurality of pads on the central region of the chip is exposed out of the through hole of the packaged substrate. A plurality of metal wires is electrically connected with the plurality of connecting terminals on the central region of the packaged substrate and the plurality of pads on the central region of the active surface of the chip. A packaged body is encapsulated the packaged substrate, the chip and the plurality of metal wires, and the plurality of external connecting terminals on the packaged substrate is to be exposed. A plurality of conductive components is then electrically connected with the plurality of external connecting terminals and is arranged on the four sides of the packaged substrate.

The present invention also provides another chip packaged structure, which includes a chip having an active surface and a back surface, and a plurality of pads on the central region of the active surface of the chip. A packaged substrate having a through hole within a central region, a plurality of connecting terminals is disposed around the through hole, and a plurality of external connecting terminals is disposed on four sides of the packaged substrate, and a plurality of connecting terminals is electrically connected with the plurality of external connecting terminals by a plurality of metal traces, in which the back surface of the package substrate is fixed on the active surface of the chip by an adhesive layer, such that the plurality of pads on the central region of the chip is exposed out of the through hole within the packaged substrate, and the length of each the plurality of external connecting terminals on the packaged substrate is extended outwardly larger than that of one side of the chip. A plurality of metal wires is electrically connected with the plurality of connecting terminals on the central region of the packaged substrate and the plurality of pads on the central region of the chip. A package body is encapsulated the packaged substrate, the active surface of the chip and the plurality of metal wires, and the plurality of external connecting terminals is exposed outside the packaged body.

The present invention also provides a multi-chips in system level and wafer level package structure, which is formed by a packaged substrate, a plurality of chips, a plurality of metal wires, a packaged body and a plurality of conductive components. The packaged substrate includes a front surface and a back surface, and a plurality of external connecting terminals is disposed on four sides of the front surface of the packaged substrate. A plurality of chip arrangement regions is arranged on the packaged substrate, a through hole is disposed within each the plurality of chip arrangement regions of the packaged substrate, and a plurality of connecting terminals is disposed adjacent one side of each the plurality of through holes. The plurality of connecting terminals is electrically connected with the plurality of external connecting terminals by a plurality of metal traces.

Each the plurality of chips includes an active surface and a back surface and a plurality of pads is disposed on the active surface of each the plurality of chips. The location of each the plurality of pads is corresponding to the that of the through holes of the packaged substrate. Each the plurality of chips is arranged on each the plurality of chip arrangement regions and the active surface of each the plurality of chips is adhered to the back surface of the packaged substrate, such that the plurality of pads on the active surface of each the plurality of chips is to be exposed out of the through hole within the packaged substrate. The plurality of metal wires is provided for electrically connecting with the plurality of connecting terminals and the plurality of pads on the active surface of each the plurality of chips. The packaged body is provided for filling into the through hole within each the plurality of chip arrangement regions to encapsulate the plurality of connecting terminals, the plurality of pads on the active surface of each the plurality of chips, the plurality of metal wires and to locally encapsulate the front surface of the packaged substrate adjacent each the plurality of through holes within each the plurality of chip arrangement regions. The plurality of conductive components is disposed on the plurality of external connecting terminals on four sides of the front surface of the packaged substrate, in which a height of each the plurality of conductive components and a distance between the top of the packaged body and the active surface of each the plurality of chips are the same.

The present invention also provides another embodiment of the multi-chips in system level and wafer level package structure, which is formed by a packaged substrate, a plurality of chips, a plurality of metal wires, a packaged body and a plurality of conductive components. The packaged substrate includes a front surface and a back surface and a plurality of external connecting terminals is disposed on four sides of the front surface of the packaged substrate. A plurality of chip arrangement regions is arranged on the packaged substrate, each the plurality of chip arrangement regions includes a through hole with a step structure and a plurality of connecting terminals is disposed on the step structure of each the plurality of through holes within each the plurality of chip arrangement region. The plurality of connecting terminals is electrically connected with the plurality of external connecting terminals by the plurality of metal traces.

Each the plurality of chip includes an active surface and a back surface and a plurality of pads on the active surface of each the plurality of chips. The location of each the plurality of pads is corresponding to that of the through holes of the packaged substrate. Each the plurality of chips is arranged on the chip arrangement region and the active surface of each the plurality of chips is adhered to the back surface of the packaged substrate, such that the plurality of pads on the active surface of each the plurality of chips is exposed out of the through hole and the plurality of pads on the active surface of each the plurality of chips is adjacent the step structure of the through hole. The plurality of metal wires is provided for electrically connected with the plurality of connecting terminals on the step structure of each the plurality of through holes on each the plurality of chip arrangement regions and the plurality of pads on the active surface of each the plurality of chips, such that a height of the plurality of metal wires in each the plurality of through holes and a height of each the plurality of through holes are the same. The packaged body is provided for filling into the through hole within each the plurality of chip arrangement regions to encapsulate the plurality of connecting terminals, the plurality of pads on the active surface of each the plurality of chips, and the plurality of metal wires and to locally encapsulate the front surface of the packaged substrate adjacent to each the plurality of through holes, such that a height of the packaged substrate and a height of the active surface of the plurality of chips are the same. The plurality of conductive components is disposed on the plurality of external connecting terminals on four sides of the front surface of the packaged substrate.

According to above-mentioned, the advantage of the multi-chips in system level and wafer level package structure of the present invention is that the multi-chips with different functions and size can combine with the packaged substrate, so that the multi-chips packaged structure with tiny size after the completion of packaging process and the space and size of the chip is smaller than re previous package structure.

BRIEF DESCRIPTION OF THE DRAWINGS

The present invention will be apparent to those skilled in the art by reading the following description of a preferred embodiment thereof with reference to the drawings, in which:

FIG. 2B shows a packaged substrate that is combined with the chip, and the packaged substrate having a plurality of connecting terminals and a plurality of metal traces in accordance with the present invention disclosed herein.

DETAILED DESCRIPTION OF THE PREFERRED EMBODIMENT

The present invention provides a chip packaged structure, in particular to a wafer level packaged structure is formed by using simple wire bonding process, and thus, such wafer level packaged structure can be referred to Wire-bonding Chip Scale Package (WBCSP), which can apply for large chip packaged structure. The cost can also be saved due to the simple packaged structure.

Some of the detail embodiments of the present invention will be described below. However, beside the detail description, the present invention can be generally used in other embodiments.

Figure 1:
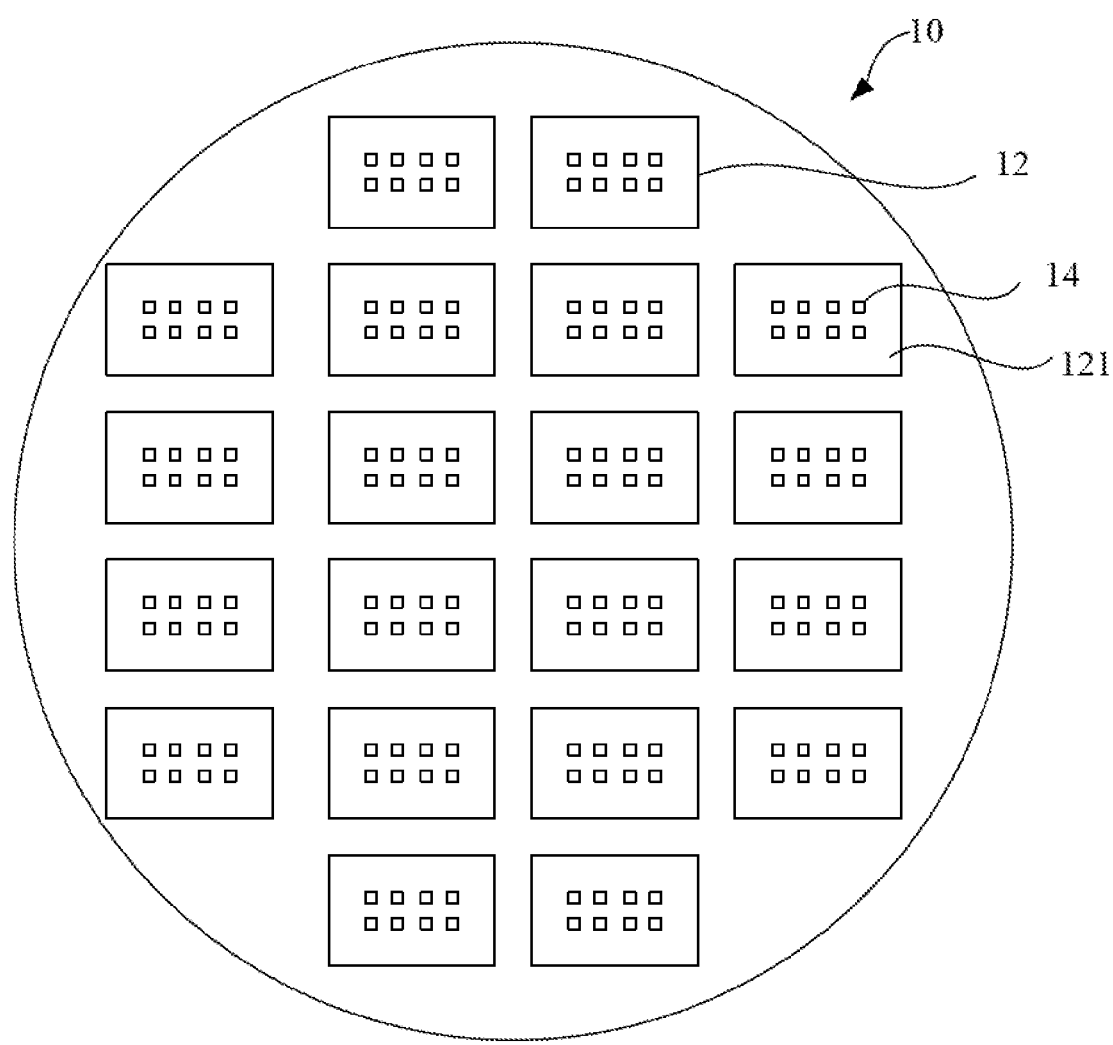
FIG. 1 is a vertical view of showing a wafer having a plurality of chips in accordance with the present invention disclosed herein.

Please refer to FIG. 1. FIG. 1 is a vertical view of a wafer having a plurality of chips. As shown in FIG. 1, the wafer 10 having a plurality of chips 12. Each the plurality of chips 12 has an active surface 121 and a back surface (not shown). A plurality of pads 14 is disposed on the central region of the active surface 121 of each the plurality of chips 12, in which each the plurality of pads 14 is formed by redistribution layer (RDL) process on the active surface 121 of each the plurality of chips 12. It is noted to illustrate that the plurality of chips 12 of the wafer 10 has completed the semiconductor manufacturing process, and each the plurality of chips 12 is NAND flash memory, NOR flash memory, or communication IC, which can be formed by large scale chip manufacturing process.

In the embodiment of the present invention with the flash memory to illustrate, in particular to a NAND flash memory with 48 pins. In addition, the manufacturing process and the redistribution layer process is not a main feature in this present invention, and thus it will not describe herein.

Figure 2A:
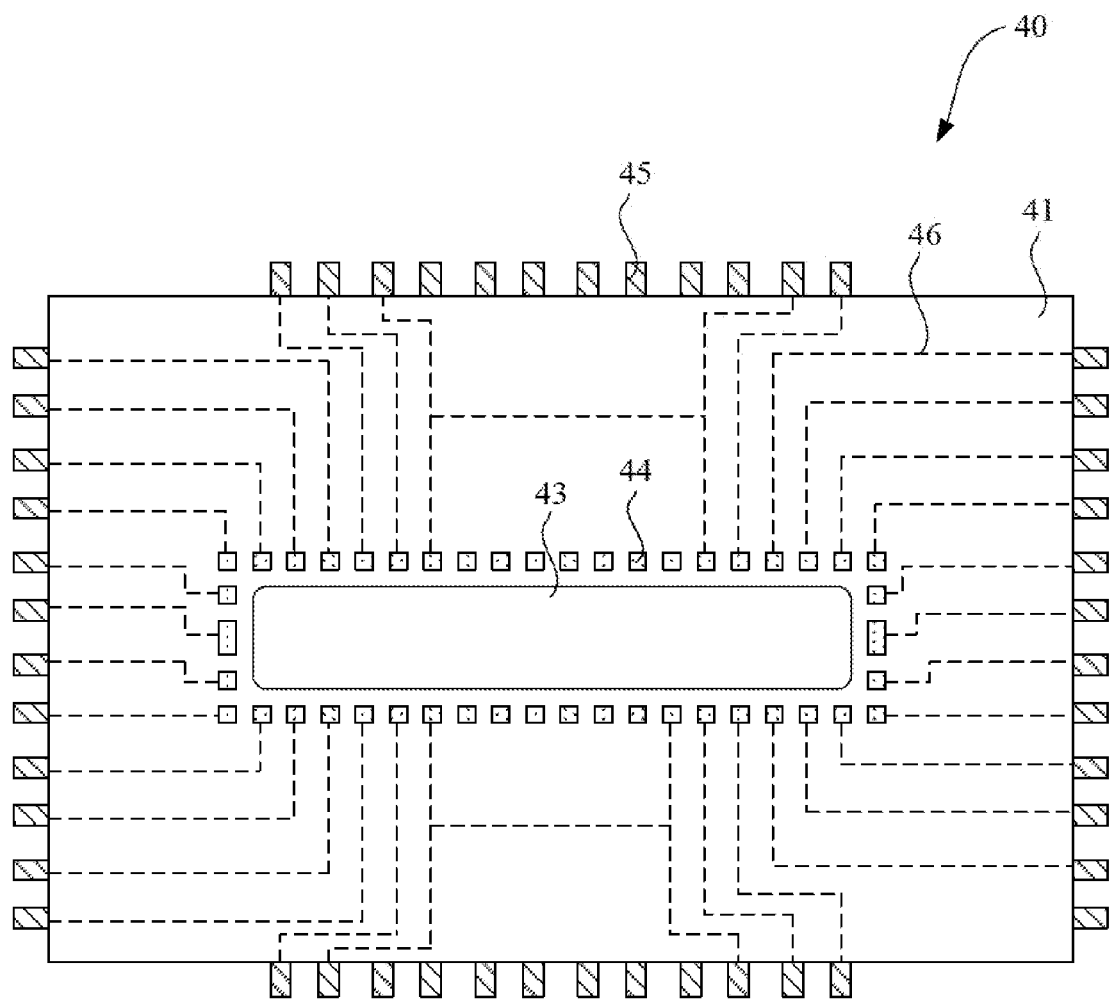
FIG. 2A is a vertical view of showing a front surface of packaged substrate in accordance with the present invention disclosed herein.

Then, please refer to FIG. 2A. FIG. 2A is a vertical view of a front surface of the packaged substrate. The packaged substrate 40 having a front surface 41 and a back surface 42, and a through hole 43 is formed within the central region of the packaged substrate 40 which is used to expose the plurality of pads 14 on the central region of the chip 12 when the packaged substrate 40 is combined with the chip 12. A plurality of connecting terminals 44 is disposed around the through hole 43 and a plurality of external connecting terminals 45 is disposed on four sides of the front surface 41 of the packaged substrate 40, in which the plurality of external connecting terminals 45 is passed through the front surface 41 and the back surface (not shown) of the packaged substrate 40. In this embodiment of the invention, the plurality of connecting terminals 44 can be golden finger or metal trace, and each the plurality of connecting terminals 44 can be isolated from each other by an insulating material (for example, plastic material) (not shown) or ceramic (not shown).

In addition, in this embodiment, the packaged substrate 40 can be a flexible print circuit board or a rigid substrate. Furthermore, for the rigid substrate, the packaged substrate 40 can be a single layer print circuit board (PCB) or a multi-layer print circuit board. The flexible print circuit board can be made of polymer.

Figure 2B:
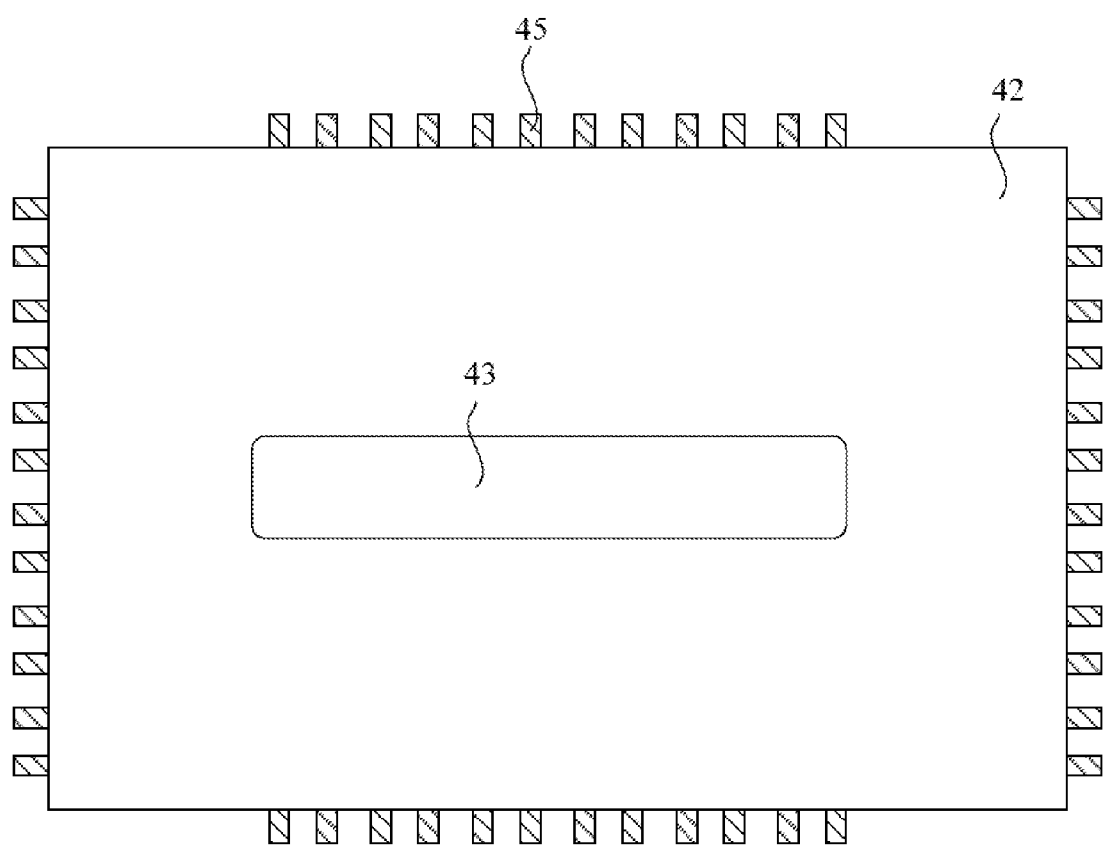
FIG. 2B is a vertical view of showing a hack surface of the packaged substrate in accordance with the present invention disclosed herein.

Next, please refer to FIG. 2B. FIG. 2B is a vertical view of a back surface of the packaged substrate. In FIG. 2B, a plurality of external connecting terminals 45 is disposed on the four sides of the back surface 42 of the packaged substrate 40.

Figure 3:
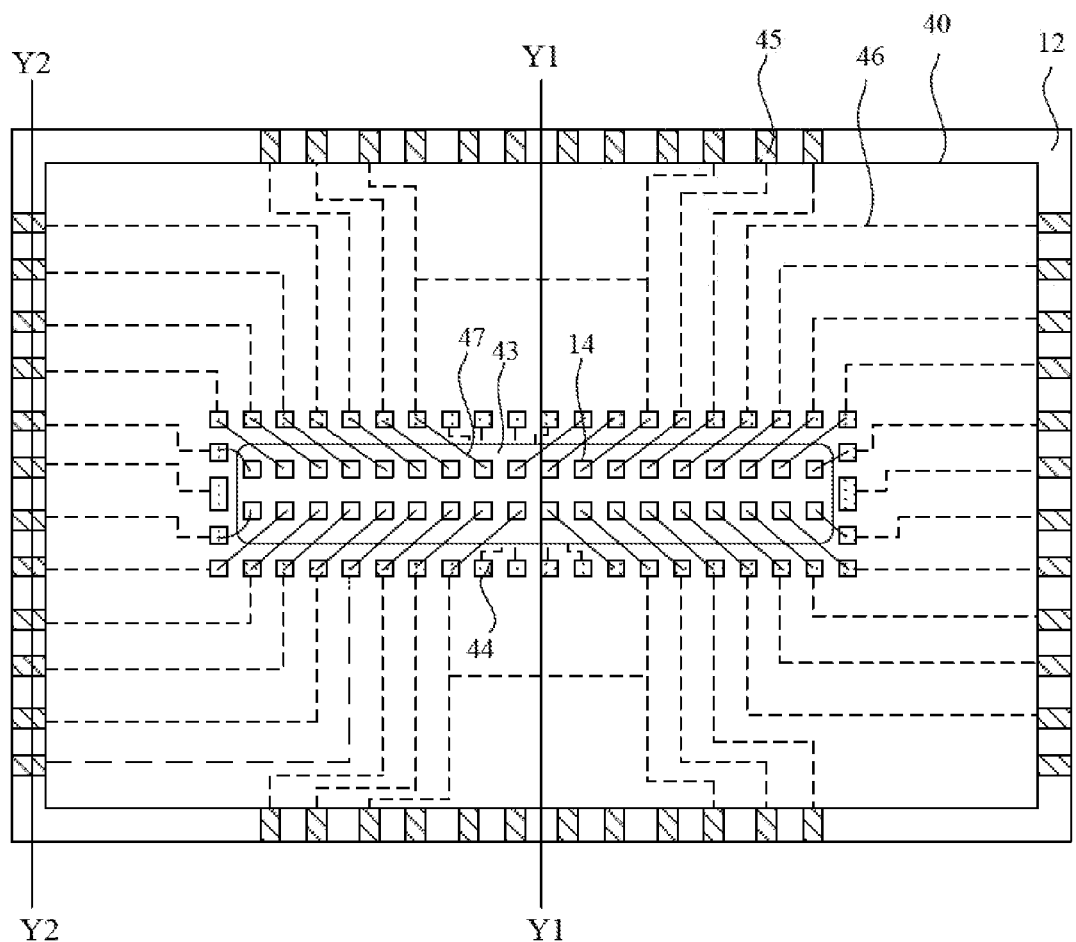
FIG. 3 is a vertical view of showing the packaged substrate which is combined with the chip, and the packaged substrate having the plurality of connecting terminals and the plurality of metal traces in FIG. 2A and FIG. 2B in accordance with the present invention disclosed herein.

Then, please refer to FIG. 3. FIG. 3 is a vertical view of FIG. 2A and FIG. 2B which illustrates a packaged substrate that is combined with the chip, in which the packaged substrate having a plurality of connecting terminals and a plurality of metal traces. In FIG. 3, the through hole 43 is formed within the central region of the front surface 41 of the packaged substrate 40, and a plurality of connecting terminals 44 is disposed adjacent the through hole 43. In addition, a plurality of external connecting terminals 45 is disposed on four sides of the packaged substrate 40, and the plurality of external connecting terminals 45 is electrically connected with the plurality of connecting terminals 44 by a plurality of metal traces 46.

Then, please also refer to FIG. 3. In this embodiment of the invention, because of the size of the packaged substrate 40 is smaller than that of the chip 12, the plurality of pads 14 on the central region of the chip 12 is to be exposed out of the through hole 43 within the central region of the packaged substrate 40 when the back surface 42 of the packaged substrate 40 is adhered to the active surface 121 of the chip 12 by an adhesive layer (not shown). In addition, the length of the plurality of external connecting terminals 45 on four sides of the packaged substrate 40 can be larger than or identical to that of the chip 12.

Also, please refer to FIG. 3. When the packaged substrate 40 is combined with the chip 12, each the plurality of connecting terminals 44 on the packaged substrate 40 and each plurality of pads 14 on the active surface 121 of the chip 12 are to be exposed and arranged corresponding to each other. Then, a plurality of metal wires 47 is provided for electrically connecting with each the plurality of connecting terminals 44 on the packaged substrate 40 and each the plurality of pads 14 on the chip 12.

Figure 4A:
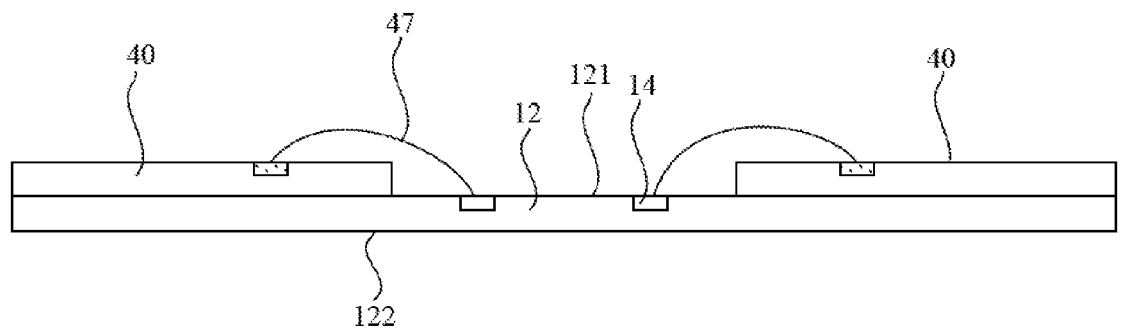
FIG. 4A is a cross-sectional view of showing Y1-Y1 direction in FIG. 3 in accordance with the present invention disclosed herein.
Figure 4B:
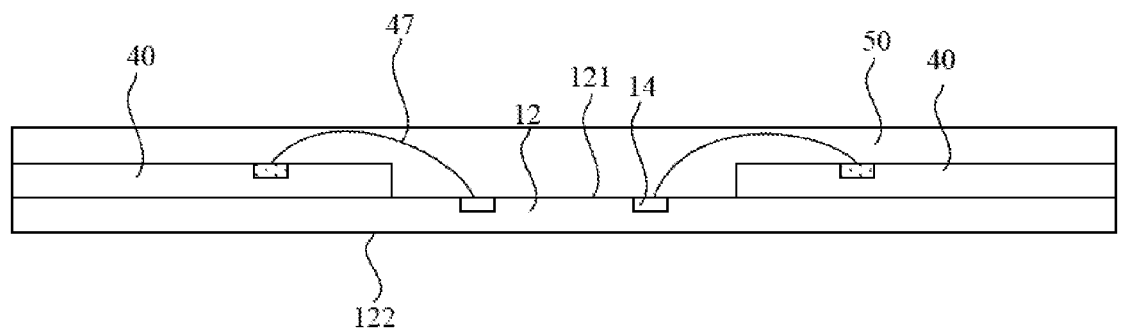
FIG. 4B is a cross-sectional schematic illustrates a packaged body that is formed by a structure of FIG. 4A in accordance with the present invention disclosed herein.

Please refer to FIG. 4A. FIG. 4A is a cross-sectional view of Y1-Y1 direction in FIG. 3. FIG. 4A shows the packaged substrate 40 that is disposed on the active surface 121 of the chip 12 in Y1-Y1 direction in FIG. 3 after wire bonding process. Then, please refer to FIG. 4B. FIG. 4B shows a packaged material that is formed on the packaged substrate 40 to form a packaged body 50 by a molding process, in which the packaged body 50 encapsulated the packaged substrate 40, the plurality of metal wires 47 and part of the active surface 121 of the chip 12.

Figure 5A:
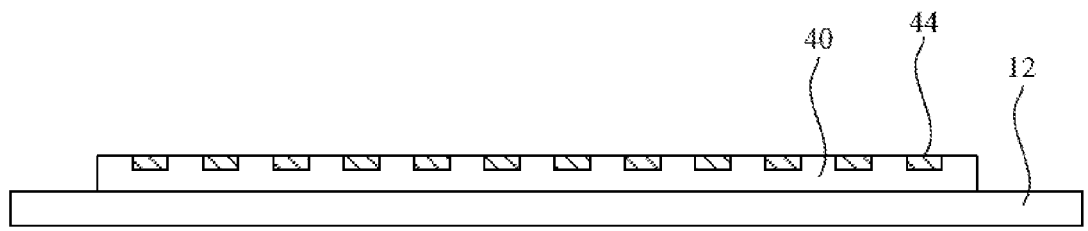
FIG. 5A is a cross-sectional view of showing Y2-Y2 direction in FIG. 3 in accordance with the present invention disclosed herein.

Moreover, please refer to FIG. 5A. FIG. 5A shows a cross-sectional view of Y2-Y2 direction in FIG. 3. In FIG. 5A, we can obtain the plurality of external connecting terminals 45 on the packaged substrate 40 in Y2-Y2 direction when the cross-section in Y2-Y2 direction in FIG. 3 (which is cross-section on the plurality of external connecting terminals 45) after wire bonding process. In FIG. 5, the plurality of external connecting terminals 45 can be optionally exposed (that is to say, the packaged body 50 is not encapsulated the plurality of external connecting terminals 45), or the plurality of external connecting terminals 45 is encapsulated by the packaged body 50 firstly, and then the plurality of external connecting terminals 45 is exposed by a semiconductor manufacturing process. The formation steps of the packaged body 50 is a well-known semiconductor technology and is not to be limited in this invention, in addition, the material of the packaged body 50 is also not to be limited herein.

Figure 5B:
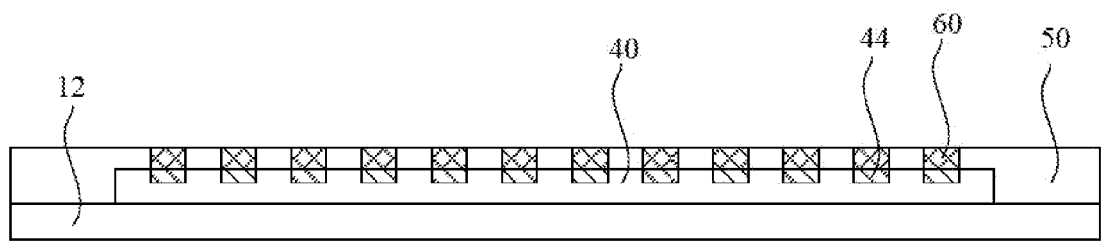
FIG. 5B is a cross-sectional schematic illustrates a conductive component is formed on the structure of FIG. 5A in accordance with the present invention disclosed herein.

Please also refer to FIG. 5B. After the plurality of external connecting terminals 45 is exposed, and screen printing process is accomplished, a plurality of conductive components 60 is disposed on the plurality of external connecting terminals 45 on the packaged substrate 40 by an electroplating process. The height of the plurality of conductive components 60 is larger than or equal to total height of the packaged substrate 30 and the packaged body 50. In addition, the bump process can also be select to form the plurality of conductive components 60 on the plurality of external connecting terminals 60, in which the plurality of conductive components 60 is the bump solder.

It is noted to illustrate that FIG. 5B is a cross-sectional view of Y2-Y2 direction in FIG. 3, such that the packaged body 50 is disposed between each the plurality of external connecting terminals 45 of the packaged substrate 40, and each the plurality of conductive components 60 is disposed on each the plurality of external connecting terminals 45.

Figure 5C:
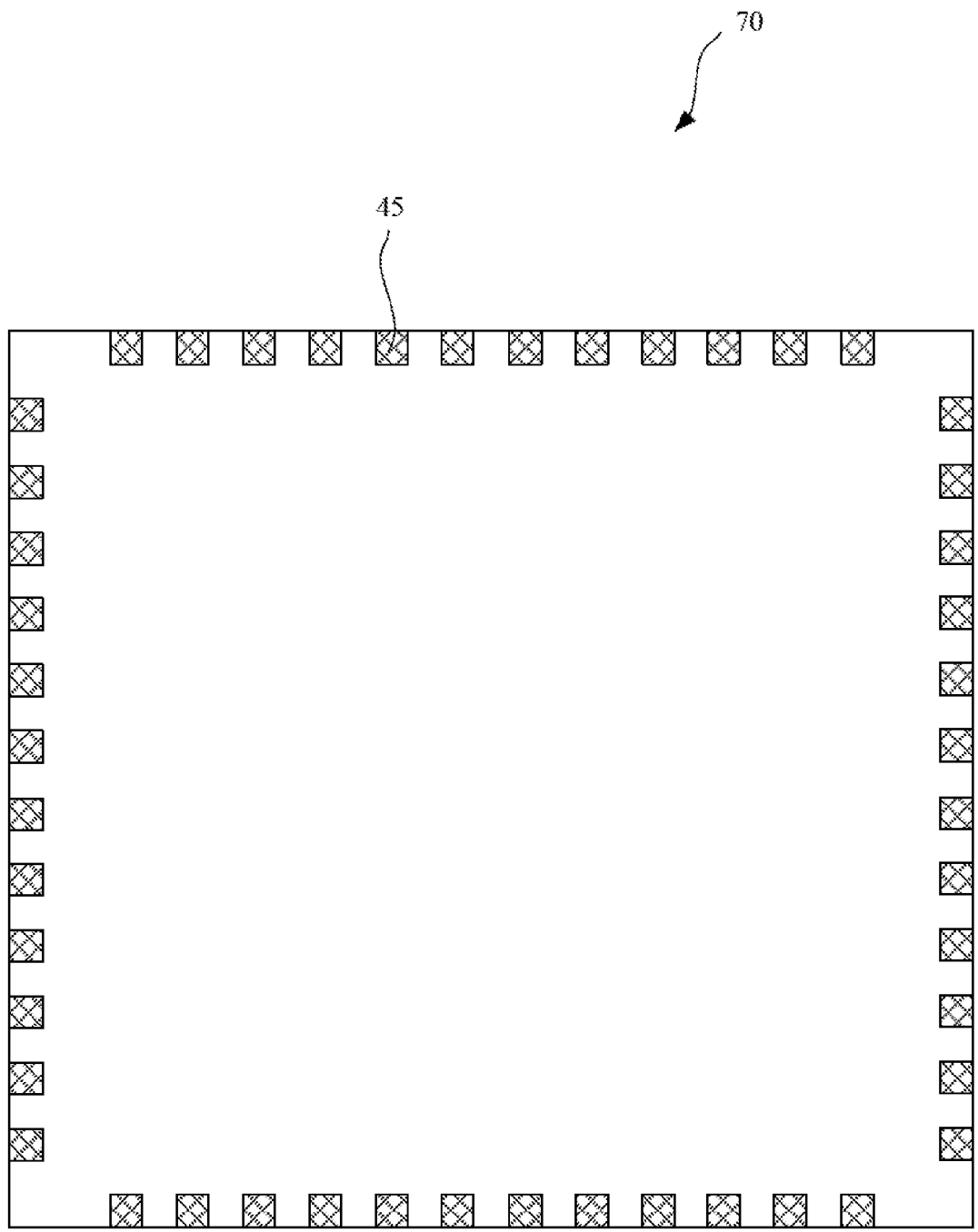
FIG. 5C is a cross-sectional schematic illustrates a back surface of the packaged substrate after an electroplating process is completed in accordance with the present invention disclosed herein.

Then, FIG. 5C is a cross-sectional view of a back surface of the packaged substrate after completing the electroplating process. In FIG. 5C, the plurality of external connecting terminals 45 is arranged on one side of the chip packaged structure 70, and the cross-sectional view of chip packaged structure 70 is shown in FIG. 5B.

Obviously, for the chip packaged structure 70 of the invention, the plurality of external connecting terminals 45 (not shown in FIG. 5C) is exposed on the front surface of the chip packaged structure 70 and is used as the connecting endpoint for electrically connecting the other electronic components (not shown) and the back surface 122 (as shown in FIG. 4A) of the chip 12 which can be used as the heat dissipation to achieve good heat dissipation efficiency, and the good heat dissipation efficiency is very important for the large scale IC chip It is noted to illustrate that although the chip packaged structure 70 is formed by a single packaged substrate 40 and a single chip 12 according to above FIG. 1 to FIG. 5C. In fact, for an embodiment of the invention, the packaging process utilizes a well-designed circuit board (not shown) with a plurality of packaged substrate 40 that is arranged on the entire wafer 10. Thus, according to above formation steps, the entire packaged structure is to be completed after the plurality of conductive components 60 is formed on the plurality of external connecting terminals 45 as shown in FIG. 5C. Then, the sawing process with the cutter (not shown) is performed to cut the entire packaged structure into a plurality of chip packaged structures 70. In this embodiment, the plurality of chip packaged structures 70 is especially for flash NAND memory packaged structure.

In addition, the present invention also provides another embodiment of the chip packaged structure, in which the manufacturing process is similar to FIG. 1 to FIG. 5C and it is not to be described herein. The different between the embodiment and aforementioned is that the sawing process is first cut the wafer 10 to obtain the plurality of chips 12. In addition, another sawing process is cut the circuit board (not shown) to obtain a plurality of packaged substrates 40. Then, each the plurality of packaged substrates 40 is arranged and fixed on the active surface 121 of each the plurality of chips 12 to obtain the structure as the vertical view of FIG. 6. It is noted to illustrate that the formations steps of the plurality of metal traces (not shown) on the packaged substrate 40 and the formation steps of the packaged substrate 40 on the chip 12 is similar as above FIG. 1 to FIG. 5C, and thus, it is not to be described in detail herein.

Figure 6:
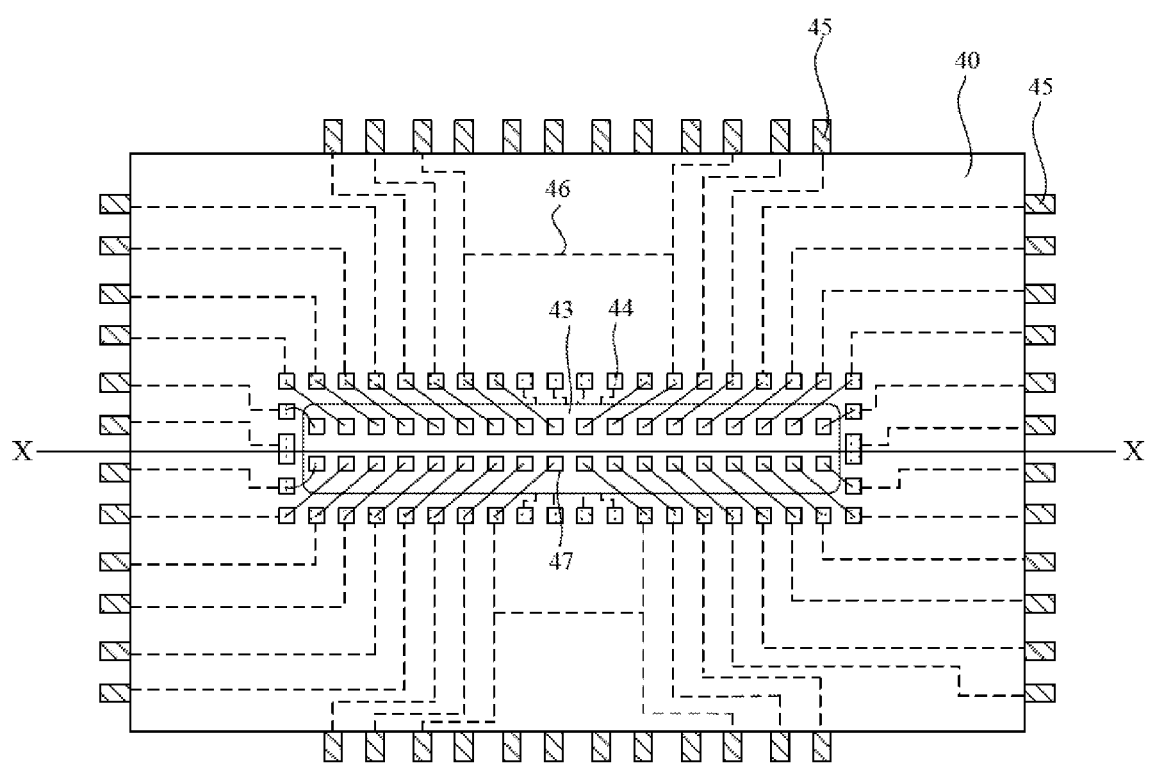
FIG. 6 is a vertical view of FIG. 2A
Figure 7A:
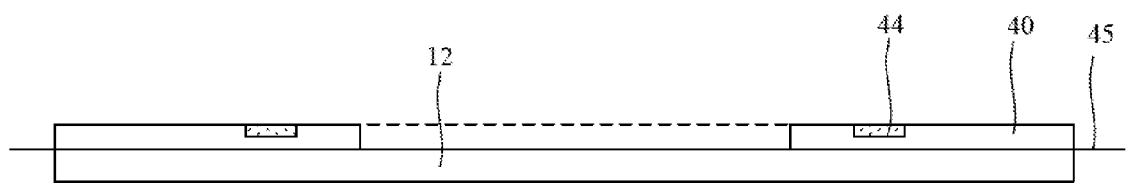
FIG. 7A is a cross-sectional view of X-X direction in FIG. 6 in accordance with the present invention disclosed herein.

If the cross-section is in X-X direction in FIG. 6, the packaged substrate 40 with the plurality of external connecting terminals 45 is disposed on the chip 12, in which the length of each the plurality of external connecting terminals 45 is larger than that of the one side of the chip 12. Due to the FIG. 7A is X-X cross-sectional view of FIG. 6, and thus, FIG. 7A merely shows the packaged substrate 40 and the plurality of connecting terminals 44. The dotted line in FIG. 7A represents the location of the chip 12, and thus, the chip 12 and the plurality of pads 14 cannot show in X-X direction in FIG. 7A.

Figure 7B:
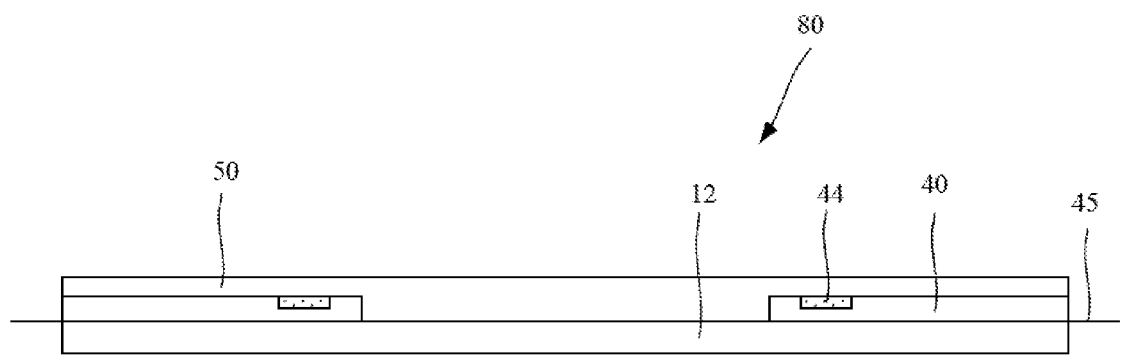
FIG. 7B is a cross-sectional view of a screen-printing process is performed on the structure of FIG. 7A to form a packaged body in accordance with the present invention disclosed herein.

Next, please refer to FIG. 7B. FIG. 7B is a cross-sectional schematic illustrates a packaged body is provided for encapsulating the packaged substrate and the chip, and the plurality of external connecting terminals on one side of the packaged substrate region is exposed out of the packaged body Herein. FIG. 7B is the cross-sectional view of X-X direction in FIG. 6. FIG. 7B merely shows the packaged substrate 40 and the chip 12 which is encapsulated by the packaged body 50, and the plurality of external connecting terminals 45 is exposed out of the packaged body 50, but the plurality of pads 14 of the chip 12 and the plurality of metal wires 47 is electrically connected the packaged substrate 40 with the chip 12 that did not show in FIG. 7B.

Figure 7C:
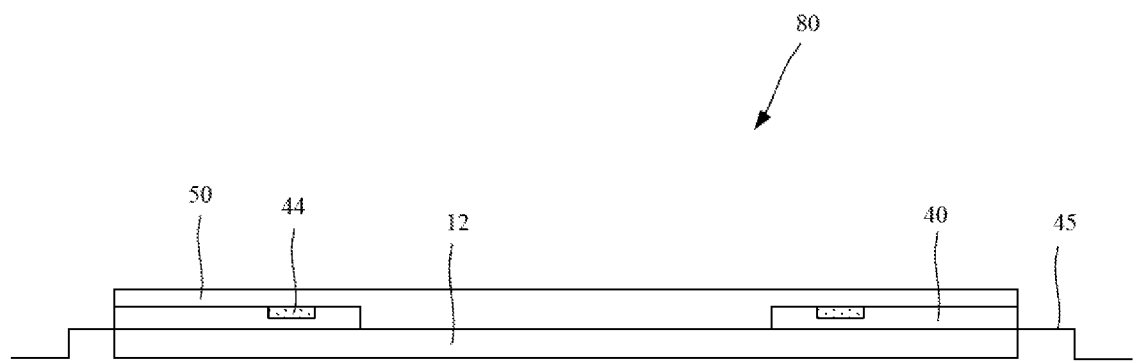
FIG. 7C is an cross-sectional schematic illustrates a stamp process that is performed on a plurality of external connecting terminals to form an inner lead and an outer lead in accordance with the present invention disclosed herein.

Then, please refer to FIG. 7C. FIG. 7C shows a lead frame with an inner lead and an outer lead which is formed by stamping a plurality of external connecting terminals of the packaged substrate region with stamping process. In FIG. 7C, for each the plurality of chip packaged structures 80 can electrically connect with other components (not shown), the plurality of external connecting terminals 45 of each the plurality of chip packaged structures 80 is stamped to form as a structure of a lead frame with the inner lead and the outer lead. Thus, each the plurality of chip packaged structures 80 can electrically connect with external component (not shown) via the inner lead (not shown) and the outer lead (not shown).

Figure 8:
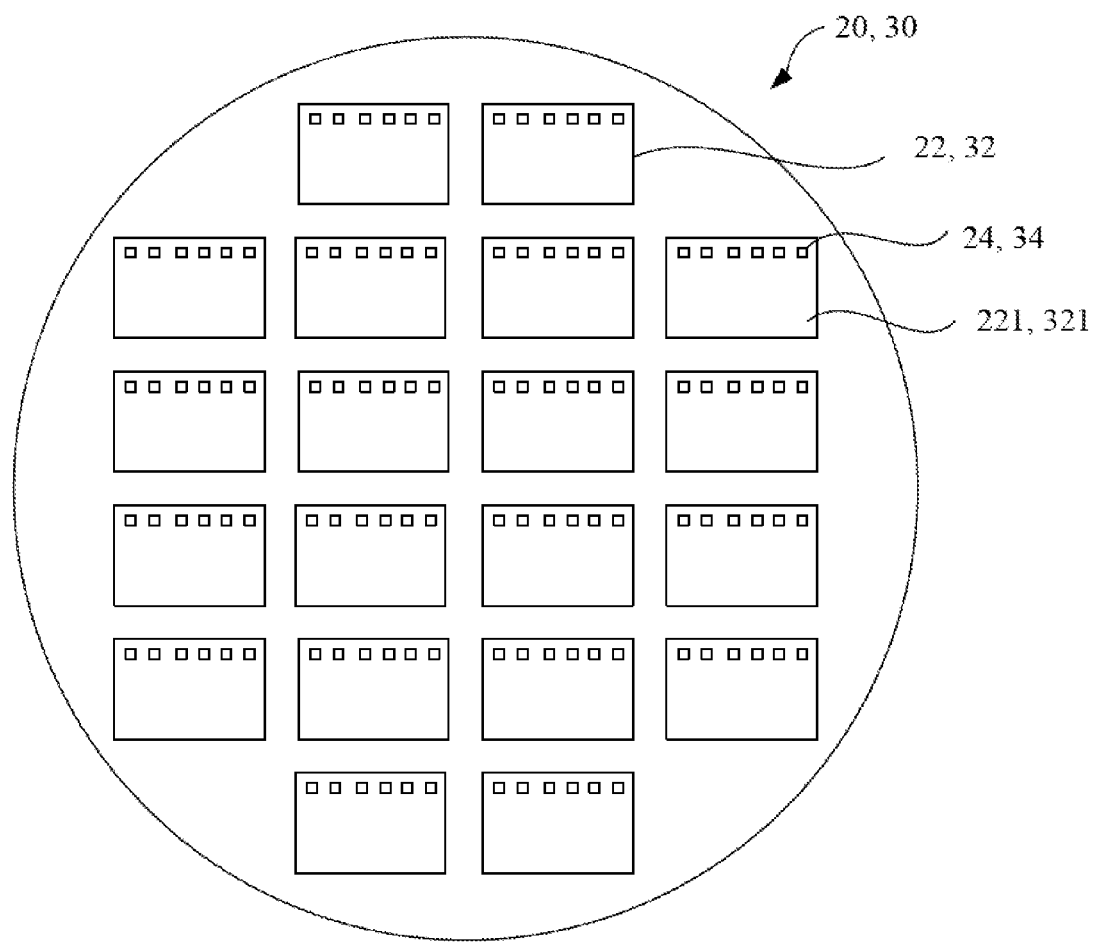
FIG. 8 is vertical views of showing a wafer having a plurality of chips in accordance with the present invention disclosed herein.

The present invention also provides another aspect of multi-chips packaged structure. Please refer to FIG. 8. The wafers 20, 30 includes a plurality of chips 22, 32 and each the plurality of chips 22, 32 includes an active surface 221, 321 and a back surface (not shown in FIG. 8). In this embodiment, a plurality of pads 24, 34 is disposed on one side of the active surface 221, 321 of each the plurality of chips 22, 32. Similarly, each the plurality of pads 24, 34 is formed by redistribution layer (RDL) process on one side of the active surface (not shown) of the plurality of chips 22, 32. Accordingly, the wafer 10 in FIG. 1A and the wafers 20, 30 in FIG. 8 may have the same functions or different functions.

Figure 9A:
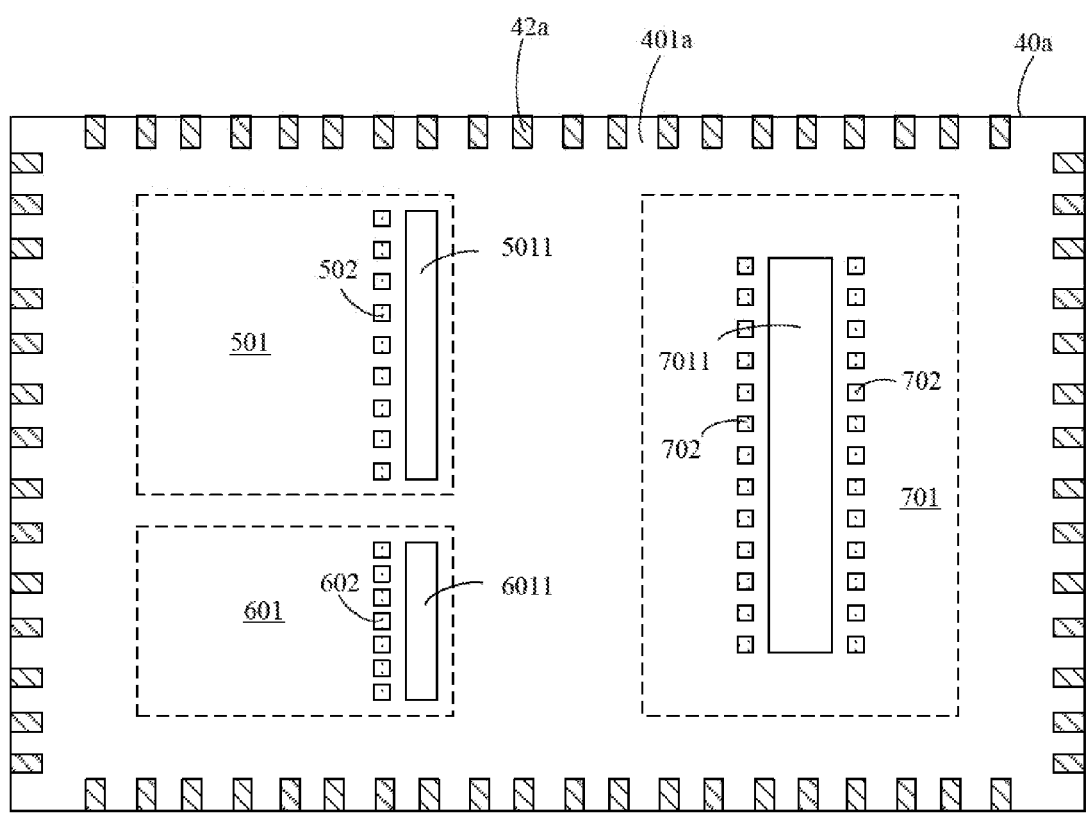
FIG. 9A is a vertical view of showing a front surface of a packaged substrate in accordance with the present invention disclosed herein.
Figure 9B:
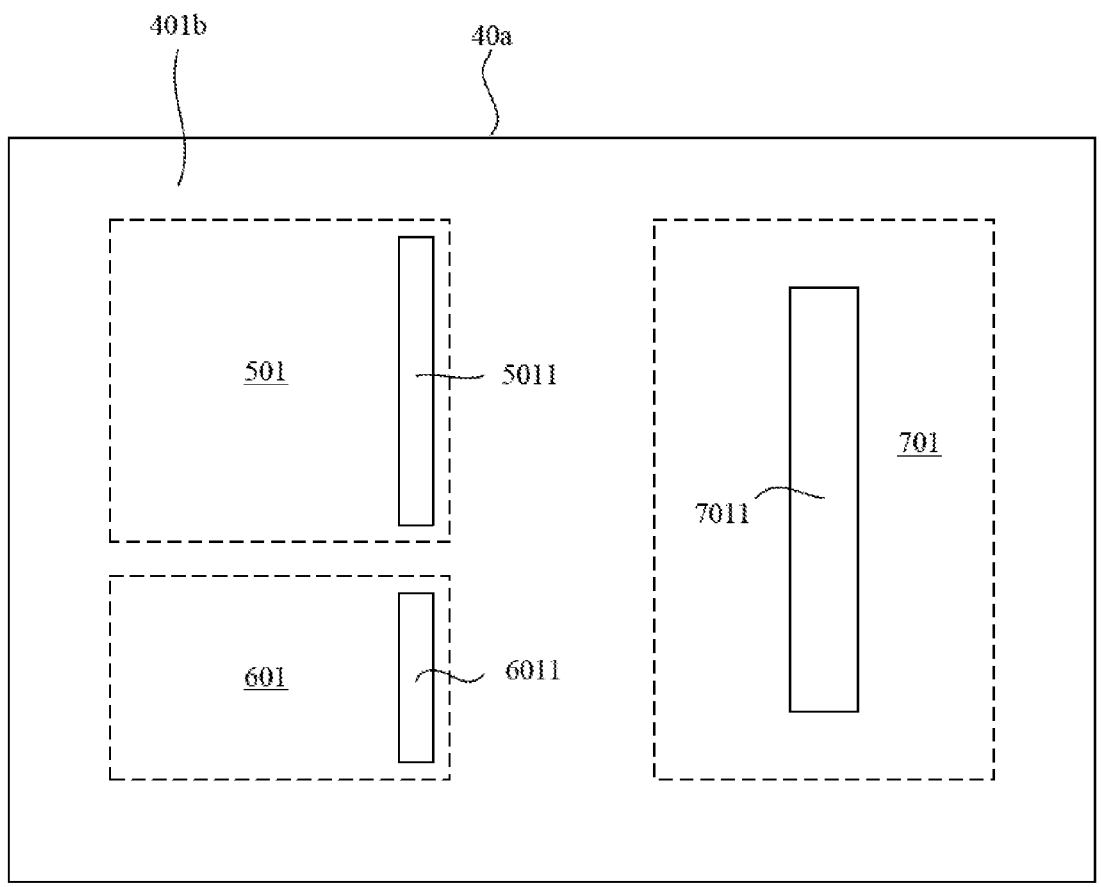
FIG. 9B is a vertical view of showing a back surface of a packaged. substrate in accordance with the present invention disclosed herein.

Then, please refer to FIG. 9A and FIG. 9B. FIG. 9A is a vertical view of the front surface of the packaged substrate and FIG. 9B is a vertical view of the back surface of the packaged substrate. The packaged substrate 40a includes a front surface 401a (as shown in FIG. 9A) and a back surface 401b (as shown in FIG. 9B). A plurality of external connecting terminals 42a is disposed on four sides of the front surface 401a of the packaged substrate 40a. It is necessary to illustrate that the plurality of external connecting terminals 42a, which is provided for electrically connecting with other electronic components (not shown), is disposed on four sides of the front surface 42a of the packaged substrate 40a. In this embodiment of the present invention, each of the plurality of the external connecting terminals 42a is golden finger or metal trace, and each the plurality of external connecting terminals 42a can be isolated from each other by an insulating material (for example, plastic material) (not shown) or ceramic (not shown), but it is not to limited herein.

In addition, a plurality of chip arrangement regions 501, 601, 701(the chip arrangement region is surrounded by the dotted line as shown in FIG. 9A and FIG. 9B) is predetermined on the packaged substrate 40a. A plurality of through holes 5011, 6011, 7011 is disposed within each the plurality of chip arrangement regions 501, 601, 701. The plurality of through holes 5011, 6011, 7011 is provided for exposing the plurality of pads (14, 24, 34) on the active surface (121, 221, 321) of each the plurality of chips (12, 22, 32) when the package substrate 40a is fixedly connected with a plurality of chips (12, 22, 32). It should be noted to illustrate that the plurality of chip arrangement regions 501, 601, 701 is convenient for displacing and aligning each chips (12, 22, 32) on the packaged substrate 40a and the plurality of chip arrangement regions 501, 601, 701 is not a real region on the package substrate 40a. Furthermore, the sizes of the plurality of chip arrangement regions 501, 601, 701 and the locations of the plurality of through holes 5011, 6011, 7011 can design for the demand of user and it is not to be limited in this embodiment, and not only to limit the structure as shown in FIG. 9A and FIG. 9B. Similarly, the packaged substrate 40a is a flexible substrate or a rigid substrate. Furthermore, for the rigid substrate, the packaged substrate 40a can be a single layer print circuit board (PCB) or a multi-layer print circuit board. The flexible print circuit board can be made of polymer.

Figure 10:
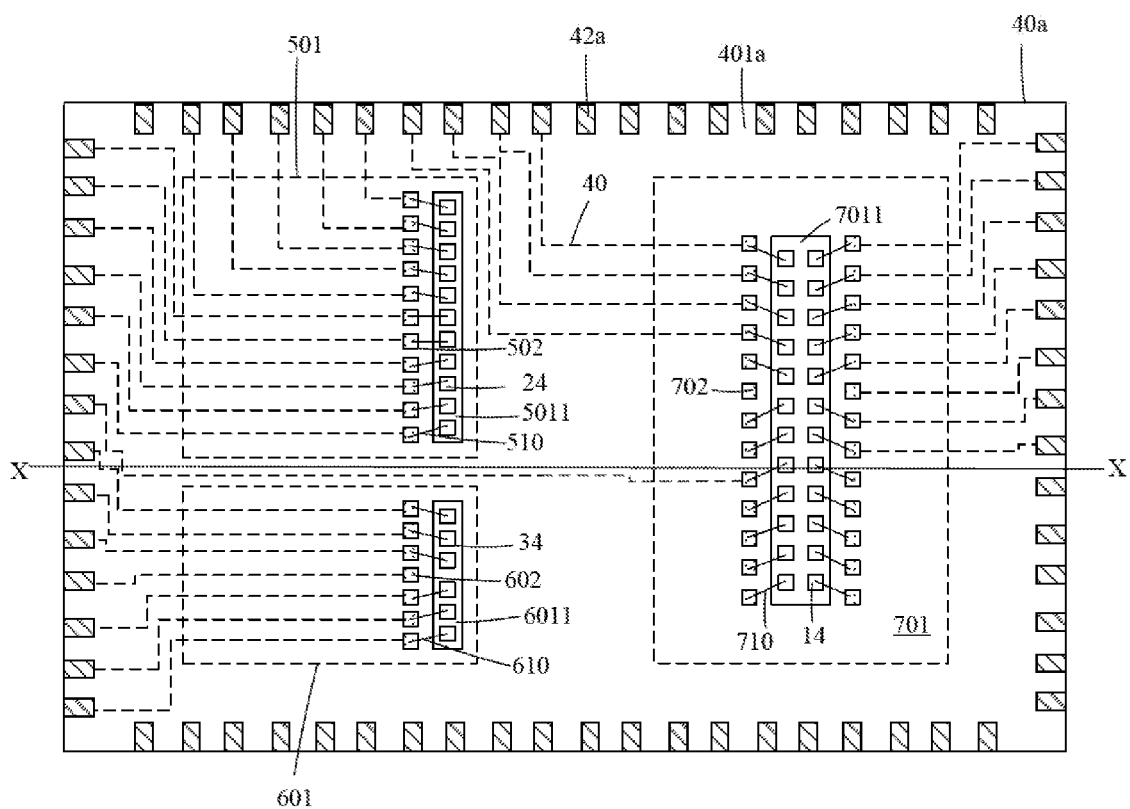
FIG. 10 is a vertical view of showing the plurality of connecting terminals electrically connected the plurality of external connecting terminals by a plurality of metal traces and the packaged substrate is combined with the plurality of chips in FIG. 2A and FIG. 2B in accordance with the present invention disclosed herein.

Please refer to FIG. 10. FIG. 10 is a vertical view of FIG. 9A and FIG. 9B which illustrates a packaged substrate that is combined with the plurality of chips, in which a plurality of connecting terminals is electrically connected with a plurality of external connecting terminals by a plurality of metal traces. It should be to illustrate that the dotted line represents a plurality of metal traces 40 and in order to avoid the complication of diagram, the part of the plurality of metal traces 40 is not shown in FIG. 10. As shown in FIG. 10, a plurality of second connecting terminals 502 and the plurality of third connecting terminals 602 are respectively disposed adjacent one side of the through holes 5011, 6011 in the chip arrangement regions 501, 601. A plurality of first connecting terminals 702 is surrounded the two sides of the through hole 7011 in the chip arrangement region 701. The plurality of first connecting terminals 702, the plurality of second connecting terminals 502 and the plurality of third connecting terminals 602 are electrically connected with the plurality of external connecting terminals 42a on four sides of the front surface 401 a of the packaged substrate 40a respectively by the plurality of metal traces 40. The plurality of metal traces 40 is formed on the packaged substrate 40a by screen printing method or electroplating process, the way of the formation for the plurality of metal traces 40 is not limited in this embodiment of the invention.

Then, the active surface of each chips 12, 22, 32 are faced-up which is picked respectively by chip pick-and-place machine not shown) to dispose on the back surface 401b of the packaged substrate 40a. In this embodiment, each chips 12, 22, 32 may have different functions and different sizes. For example, DRAM (dynamic random access memory), NAND flash memory, NOR flash memory, communication IC, processing chip, or chip with logical I/O, but it is not to limited herein. The following embodiment utilizes the plurality of first pads 14 on the central region of the active surface 121 of the first chip 12, the plurality of second pads 24 on one side of the active surface 221 of the second chip 22, and the plurality of third pads 34 on one side of the active surface 321 of the third chip 32 to illustrate the formation of multi-chips in system level and wafer level package structure. Accordingly, the plurality of first pads 14 on the central region of the active surface 121 of the first chip 12, the plurality of second pads 24 on one side of the active surface 221 of the second chip 22, and the plurality of third pads 34 on one side of the active surface 321 of the third chip 32 are respectively aligned the chip arrangement regions 501, 601, 701 and each active surfaces 121, 221, 321 of each chips 12, 22, 32 are faced-up to fix on the back surface 401b of the packaged substrate 40, such that the plurality of first pads 14 on the central region of the first chip 12 is exposed out of the through hole 7011, the plurality of second pads 24 on one side of the second chip 22 and the plurality of third pads 34 on one side of the third chip 32 are exposed out of the through holes 5011, 6011 respectively.

Please continue to refer to FIG. 10, After the packaged substrate 40a is aligned and combined with the first chip 12, the second chip 22 and the third chip 32, the wire bonding process is performed with the plurality of metal wires 710, 510, 610 for electrically connecting each the plurality of first connecting terminals 702 and the plurality of first pads 14 on the first chip 12, each the plurality of second connecting terminals 502 and the plurality of second pads 24 on the second chip 22, and each the plurality of the third connecting terminals 602 and each the plurality of third pads 34 on the third chip 32 respectively, such that the first chip 12, the second chip 22, the third chip 32 and the packaged substrate 40a are electrically connected to each other.

Figure 11A:
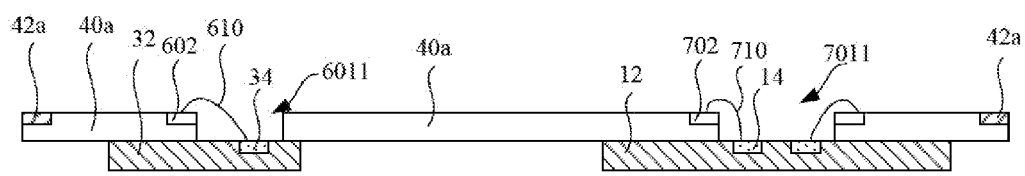
FIG. 11A is a cross-sectional view of showing X-X direction in FIG. 10 in accordance with the present invention disclosed herein.
Figure 11B:
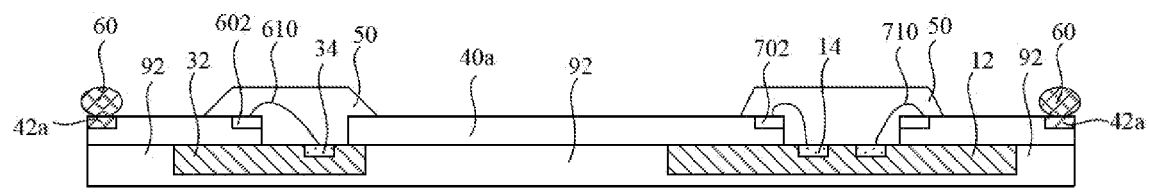
FIG. 11B is a cross-sectional schematic illustrates a packaged body that is formed by a structure of FIG. 11A in accordance with the present invention disclosed herein.

Next, please refer to FIG. 11A. FIG. 11A. shows a cross-sectional view of X-X direction in FIG. 10. As shown in FIG. 11A, after the wire bonding process, the cross-section view of showing X-X direction in the packaged substrate 40a is disposed on the first chip 12 and the third chip 32. Please refer to FIG. 11B, FIG. 11B shows the cross-sectional view of the package structure of FIG. 11A. In FIG. 11B, the dispensing system is performed with the package material for injecting or dispensing into the through holes 5011, 6011, 7011 within the packaged substrate 40a to form the packaged body 50, and the packaged body 50 is locally encapsulated the first chip 12, the plurality of connecting terminals 702, the plurality of first pads 14 on the central region of the active surface 121 of the first chip 12 and the plurality of metal wires 710 in the chip arrangement region 701, the packaged body 50 is locally encapsulated the second chip 22, the plurality of second connecting terminals 502, the plurality of second pads 24 on one side of the active surface 221 of the second chip 22 and the plurality of metal wires 510 in chip arrangement region 501, and the packaged body 50 is locally encapsulated the third chip 32, the plurality of third connecting terminals 602, the plurality of pads 34 on one side of the active surface 321 of the third chip 32 and the plurality of metal wires 601. That is to say, the package material is locally encapsulated the structure of FIG. 11B, the package material is filled into the through holes 5011, 6011, 7011 and locally covered the front surface 401a of the packaged substrate 40a adjacent each through holes 5011, 6011, 7011 and the molding process is not performed for whole structure of FIG. 11B. Thus, the pollution caused by the package material can be reduced during the molding process.

Then, please continue to refer to FIG. 11B. After the molding process, a plurality of conductive components 60 is formed on the plurality of external connecting terminals 42a on the front surface 401a of the packaged substrate 40a by reflow soldering process or way soldering process. A height of each the plurality of conductive components 60 is larger than or equal to a total height of the packaged substrate 40a and the packaged body 50. Furthermore, the plurality of conductive components 60 is formed by bump process and the plurality of conductive components 60 is bump. After the completion of the wire bonding process, the distance between the top of each the plurality of metal wires 610, 701 and the active surface of each chips 12, 32 is in a range from 40 um to 60 um, and the preferred distance is 50 um. After the completion of the package process, the distance between the top of the package body 50 and the active surfaces 121, 221, 321 of each chips 12, 22, 32 is in a range from 80 um to 100 um. Otherwise, because each the chips 12, 22, 32 may have different functions and different sizes, the thickness of each chips 12, 22, 32 may also different. In order to the requirement of user, the back surface (not shown) of each chips 12, 22, 32 are milled alternatively to have the thickness in 1.5 mil-4 mil and the preferred thickness is in a range from 2 mil to 4 mil, such that each chips 12, 22, 32 have the same thickness. In another embodiment of the present invention, for the miniaturization of package structure size, the thickness of complete the plurality of chips stacked structure is polished which is not more than 4 mil.

In another alternative embodiment, each the plurality of chips 12, 22, 32 on the packaged substrate 40a are not required to perform milling process. After the formation of the package structure by way of the package process, the back surface of the chips 12, 22, 32 is milled to the thickness in a range 1.5 mil to 4 mil, and the preferred thickness is 2 mil to 4 mil. Accordingly, each chips 12, 22, 32 has the same thickness. In another embodiment, each chips 12, 22, 32 may have different thicknesses. For example, when the third chip 32 is a memory module which is stacked by a plurality of third chips 32, the thickness of the memory module is thicker than that of the first chip 12 and/or the second chip 22 and the first chip 12. Thus, when the first chip 12, second chip 22 and the memory module is stacked by a plurality of third chips 32 are disposed respectively on the back surface 401b of the packaged substrate 40a, the polishing process may not to perform such that the first chip 12, the second chip 22, and the memory module is stacked by a plurality of third chips 32 have the different sizes on the back surface 401b of the packaged substrate 40a. Since, due to the package process without using polishing process, the manufacturing costs and pollution can be reduced, and the yield of the package structure can be improved.

Please also refer to FIG. 11B, in order to prevent the interference with other electronic components for the multi-chips in system level and wafer level package structure, an anti-interference glue 92 is coated on the back surface 401b of the packaged substrate 40a, and the back surface of the first chip 12, the back surface of the second chip 22, and the back surface of the third chip 32, in which the thickness of the anti-interference glue 92 is in a range from 200 um to 300 um and the thickness of the anti-interference glue 92 is larger than the back surface of the first chip 12, the back surface of the second chip 22, and the back surface of the third chip 32, such that the anti-interference glue 92 encapsulated the back surface of the second chip 22, and the back surface of the third chip 32. In this embodiment, the components of the anti-interference glue 92 can be silicone, acrylic, urethane or epoxy and the in addition to coating process, the other formation can be dipping, spraying, brushing or selective coating, but it is not to be limited herein.

Figure 12A:
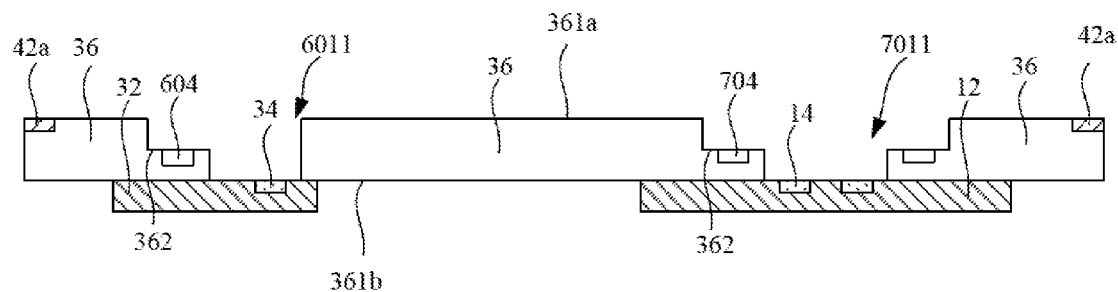
FIG. 12A is as cross-sectional schematic illustrates packaged substrate having a through hole with a step structure therein that is combined with a plurality of chips in accordance with the present invention disclosed herein.

The present invention also provides another multi-chips in system level and wafer level package structure. It should be noted that the element and the formation are the same as aforementioned, and thus the following embodiment is not described in detail. The differences between the above embodiment in that the through holes 5011, 6011, 7011 includes a step structure 362 within the packaged substrate 36 as shown in FIG. 12A. The plurality of first connecting terminals 704, the plurality of second connecting terminals 504, and the plurality of third connecting terminals 604 are disposed respectively on the step structure 362. As similar to above embodiment, the plurality of first connecting terminals 704, the plurality of second connecting terminals 504 and the plurality of third connecting terminals 604 are electrically connected with the plurality of external connecting terminals 42a by the plurality of metal traces 40 which is formed by screen printing or electroplating. Thus, as similar to above embodiment, the active surface 121 of the first chip 12, the active surface 221 of the second chip 22, and the active surface 321 of the third chip 32 are faced-up to dispose on the back surface 361b of the packaged substrate 36. The first chip 12, the second chip 22, and the third chip 32 are corresponding to the location of the through holes 5011, 6011, 7011 respectively When the packaged substrate 36 is combined with the first chip 12, the second chip 22 and the third chip 32, the plurality of first pads 14 on the first chip 12 is disposed adjacent the plurality of first connecting terminals 704 on the step structure 362 of the through hole 7011 and the plurality of first pads 14 is exposed out of the through hole 7011, the plurality of second pads 24 on the second chip 22 is disposed adjacent the plurality of second connecting terminals 504 on the step structure 362 of the through hole 5011 and the plurality of second pads 24 is exposed out of the through hole 5011, and the plurality of third pads 34 on the third chip 32 is disposed adjacent the plurality of first connecting terminals 604 and the plurality of third pads 34 is exposed out of the through hole 6011.

Figure 12B:
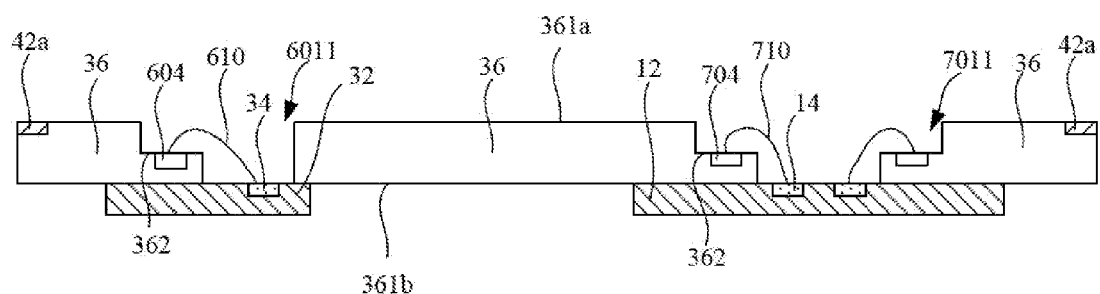
FIG. 12B is a cross-sectional view of showing the plurality of metal wires is formed in the structure of FIG. 12A by wiring bonding process in accordance with the present invention disclosed herein.

Next, please refer to FIG. 12B. In this embodiment, one end of each the plurality of metal wires 510, 610, 710 is formed on each the plurality of pads 14 on the first chips 12, each the plurality of pads 24 on the second chip 22 and each the plurality of pads 34 on the third chip 32, and another end of each the plurality of metal wires 510 is formed on each the plurality of first connecting terminals 704 on the step structure 362 within the through hole 7011, the plurality of metal wires 510 is formed on each the plurality of second connecting terminals 504 on the step structure 362 within the through hole 5011 and the plurality of metal wires 610 is formed on each the plurality of third connecting terminals 604 on the step structure 362 within the through hole 6011 by wire bonding process so as to the first chip 12, the second chip 22 and the third chip 32 and the packaged substrate 36 are electrically connected to each other.

Figure 12C:
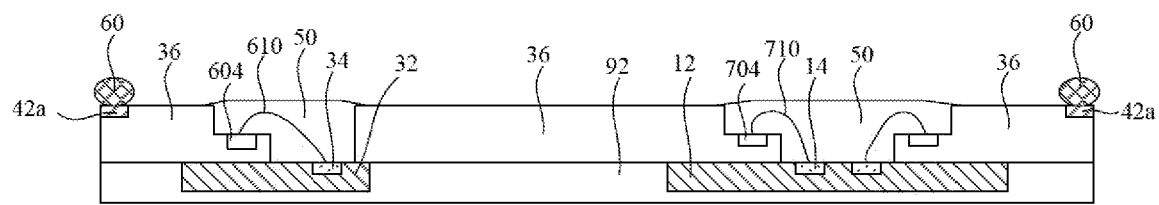
FIG. 12C is a cross-sectional view of Showing a packaged body form in the structure of FIG. 12B and a plurality of conductive components on the front surface of the packaged substrate and an anti-interference glue encapsulated the back surface of the plurality of chips in accordance with the present invention disclosed herein.

Please refer to FIG. 12C. As shown in FIG. 12C, after wire bonding process, the dispensing process with the package material is filled into the through holes 5011, 6011, 7011 and covered part of the packaged substrate 36 to formed a packaged body 50. The packaged body 50 encapsulated the plurality of first connecting terminals 704 within the through hole 7011, the plurality of first pads 14 on the active surface 121 of the first chip 12. The plurality of metal wires 710 in the chip arrangement region 701 and locally encapsulated the front surface 361a of the packaged substrate 36 adjacent the through hole 7011. The packaged body 50 encapsulated the plurality of second connecting terminals 504 within the through hole 5011 the plurality of second pads 24 on the active surface 221 of the second chip 22. The plurality of metal wires 510 in the chip arrangement region 501 and locally encapsulated the front surface 361a of the packaged substrate 36 adjacent the through hole 5011. The packaged body 50 encapsulated the plurality of third connecting terminals 604 within the through hole 6011, the plurality of first pads 34 on the active surface 321 of the third chip 32. The plurality of metal wires 610 in the chip arrangement region 601 and locally encapsulated the front surface 361a of the packaged substrate 36 adjacent the through hole 7011. Accordingly, the package material is locally encapsulated the structure of FIG. 12C, the package material is filled into the through holes 5011, 6011, 7011 and locally covered the front surface 361a of the packaged substrate 36 adjacent the through holes 5011, 6011, 7011, and the molding process is not performed for whole structure of FIG. 12C. Thus, the pollution caused by the package material can be reduced during the molding process.

After the molding process, a plurality of conductive components 60 is formed on the plurality of external connecting terminals 42a on the front surface 361a of the packaged substrate 36 by reflow soldering process or wave soldering process. A height of each the plurality of conductive components 60 is larger than or equal to that of the packaged body 50. Thus, the height of the plurality of conductive components 60 can be reduced. In addition, the plurality of conductive components is formed by bump process and the plurality of conductive components 60 is bump.

Otherwise, because each the chips 12, 22, 32 may have different functions and different sizes, the thickness of each chips 12, 22, 32 may also different. In order to the requirement of user, the back surface of each chips 12, 27, 32 is polished alternatively to have the thickness in 1.5 mil-4 mil and the preferred thickness is in a range from 2 mil to 4 mil, such that each chips 12, 22, 32 have the same thickness. In another embodiment of the present invention, for the miniaturization of package structure size, the thickness of complete the plurality of chips stacked structure is polished which is not more than 4 mil. Each the plurality of chips 12, 22, 32 on the packaged substrate 36 are not required to perform polishing process. After the formation of the package structure by way of the package process, the back surface of the chips 12, 22, 32 is polished to the thickness in a range 1.5 mil to 4 mil, and the preferred thickness is 2 mil to 4 mil. Accordingly, each chips 12, 22, 32 has the same thickness. In another embodiment, each chips 12, 22, 32 may have different thicknesses. For example, when the third chip 32 is a memory module which is stacked by a plurality of third chips 32, the thickness of the memory module is thicker than that of the first chip 12 and/or the second chip 22 and the first chip 12. Thus, when the first chip 12, second chip 22 and the memory module is stacked by a plurality of third chips 32 are disposed respectively on the back surface 361b of the packaged substrate 36, the polishing process may not to perform such that the first chip 2, the second chip 22, and the memory module is stacked by a plurality of third chips 32 have the different sizes on the back surface 361b of the packaged substrate 36. Since, due to the package process without using polishing process, the manufacturing costs and pollution can be reduced, and the yield of the package structure can be improved.

Similarly, after completion of aforementioned, in order to prevent the interference with other electronic components for the multi-chips in system level and wafer level package structure, an anti-interference glue 92 is coated on the back surface 361b of the packaged substrate 36, and the back surface of the first chip 12, the back surface of the second chip 22, and the back surface of the third chip 32, in which the thickness of the anti-interference glue 92 is in a range from 200 um to 300 um and the thickness of the anti-interference glue 92 is larger than the back surface of the first chip 12, the back surface of the second chip 22, and the back surface of the third chip 32, such that the anti-interference glue 92 encapsulated the back surface of the first chip 12, the back surface of the second chip 22, the back surface of the third chip 32 and the back surface 362 of the packaged substrate 36.

Although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A multi-chips in system level and wafer level package structure, comprising:
    a packaged substrate, the packaged substrate having a front surface and a back surface, a plurality of external connecting terminals on a four sides on the front surface of the packaged substrate, a plurality of chip arrangement regions on the packaged substrate and a through hole disposed in each plurality of chip arrangement regions, a plurality of connecting terminals is disposed on one side adjacent the plurality of through holes, wherein the plurality of connecting terminals is electrically connected with the plurality of external connecting terminals by a plurality of metal traces;
    a plurality of chips, each the plurality of chips having an active surface and a back surface, a plurality of pads on the active surface of each the plurality of chips and the location of the plurality of pads is corresponding to that of the plurality of through holes of the packaged substrate, and each the plurality of chips is arranged on each the plurality of chip arrangement regions and the active surface of each the plurality of chips is fixed on the back surface of the packaged substrate, such that the plurality of pads on the active surface of each the plurality of chips is exposed out of the plurality of through holes;
    a plurality of metal wires, the plurality of metal wires is provided for electrically connecting the plurality of connecting terminals and the plurality of pads on the active surface of the plurality of chips; and
    a packaged body, the packaged body is provided for filling the plurality of through holes on each the plurality of chip arrangement regions to encapsulate the plurality of connecting terminals, the plurality of pads on the active surface of each the plurality chips, and to locally encapsulate the front surface of the packaged substrate adjacent the plurality of through holes on each the plurality of chip arrangement region.

2. The multi-chips in system level and wafer level package structure according to claim 1, wherein the packaged substrate is a print circuit board or a flexible circuit board.

3. The multi-chips in system level and wafer level package structure according to claim 1, wherein each the plurality of chips with different functions and sizes.

4. The multi-chips in system level and wafer level package structure according to claim 1, wherein the location of the plurality of pads is disposed on one side of the active surface of the plurality of chips or is disposed on a central region of the active surface of the plurality of chips.

5. The multi-chips in system level and wafer level package structure according to claim 1, wherein the thickness of the plurality of chips is in a range from 2 mil to 4 mil.

6. The multi-chips in system level and wafer level package structure according to claim 1, wherein the plurality of chips is a memory chip, a communication chip, a process chip and a chip with logic I/O.

7. The multi-chips in system level and wafer level package structure according to claim 6, wherein the memory chip is a DRAM (dynamic random access memory), a NAND flash, and a NOR flash.

8. The multi-chips in system level and wafer level package structure according to claim 6, wherein the memory chip is a memory module which is stacked by a plurality of chips with same functions and size.

9. The multi-chips in system level and wafer level package structure according to claim 1, wherein a distance between a top of each the plurality of metal wires and the active surface of each the plurality of chips is in a range from 40 um to 60 um.

10. The multi-chips in system level and wafer level package structure according to claim 1, wherein a distance between a top of the packaged body and the active surface of each the plurality of chips is in a range from 80 um to 100 um.

11. The multi-chips in system level and wafer level package structure according to claim 1, further comprising a plurality of conductive components disposed on the plurality of external connecting terminals on the four sides of the front surface of the packaged substrate, wherein a height of each the plurality of conductive components and a distance between a top of the packaged body and the active surface of each the plurality of chips are the same.

12. A multi-chips in system level and wafer level package structure, comprising:
    a packaged substrate, the packaged substrate having a front surface and a back surface, a plurality of external connecting terminals is disposed on a four sides of the front surface of the packaged substrate, a plurality of chip arrangement regions is arranged on the packaged substrate, a plurality of through holes with at least a step structure is disposed within each the plurality of chip arrangement regions, a plurality of connecting terminals is disposed on the step structure of each the plurality of through holes in each the plurality of chip arrangement regions, wherein the plurality of connecting terminal is electrically connected with the plurality of external connecting terminals by a plurality of metal traces;
    a plurality of chips, each the plurality of chips having an active surface and a back surface, a plurality of pads is disposed on the active surface of each the plurality of chips and the location of the plurality of pads is corresponding to that of the plurality of through holes of the packaged substrate, and each the plurality of chips is arranged on each the plurality of chip arrangement regions and the active surface of each the plurality of chips is fixed on the back surface of the packaged substrate, such that the plurality of pads on the active surface of each the plurality of chips is exposed out of the plurality of through holes and is adjacent the step structure of each the plurality of through holes;
    a plurality of metal wires, the plurality of metal wires is provided for electrically connecting the plurality of connecting terminals on the step structure of each the plurality of through holes of each the plurality of chip arrangement regions and the plurality of pads on the active surface of the plurality of chips, such that a height of the plurality of metal wires in the plurality of through holes and a height between the plurality of through holes and the front surface of the packaged substrate are the same; and a packaged body, the packaged body is provided for filling the through holes of each the plurality of chip arrangement regions to encapsulate the plurality of connecting terminals, the plurality of pads on the active surface of each the plurality of chips, the plurality of metals wires, and to locally encapsulate the front surface of the packaged substrate adjacent the plurality of through holes on each the plurality of chip arrangement region, such that a height of the packaged body and a height of the active surface of each the plurality of chips are the same.

13. The multi-chips in system level and wafer level package structure according to claim 12, wherein the packaged substrate is a print circuit board or a flexible circuit board.

14. The multi-chips in system level and wafer level package structure according to claim 12, wherein each the plurality of chips with different functions and sizes.

15. The multi-chips in system level and wafer level package structure according to claim 12, wherein the thickness of the plurality of chips is in a range from 2 mil to 4 mil.

16. The multi-chips in system level and wafer level package structure according to claim 12, wherein the location of the plurality of pads is disposed on one side of the active surface of the plurality of chips or is disposed on a central region of the active surface of the plurality of chips.

17. The multi-chips in system level and wafer level package structure according to claim 12, wherein the plurality of chips is a memory chip, a communication chip, a process chip and a chip with logic I/O.

18. The multi-chips in system level and wafer level package structure according to claim 17, wherein the memory chip is a DRAM (dynamic random access memory), a NAND flash, and a NOR flash.

19. The multi-chips in system level and wafer level package structure according to claim 17, wherein the memory chip is a memory module which is stacked by a plurality of chips with same functions and size.

20. The multi-chips in system level and wafer level package structure according to claim 12, further comprising a plurality of conductive components disposed on the plurality of external connecting terminals on the four sides of the front surface of the packaged substrate, wherein a height of each the plurality of conductive components and a distance between a top of the packaged body and the active surface of each the plurality of chips are the same.

* * * * *